US007072264B2

(12) United States Patent
Honma et al.

(10) Patent No.: US 7,072,264 B2
(45) Date of Patent: Jul. 4, 2006

(54) VCO WITH PHASE MODULATED OUTPUT

(75) Inventors: Hiromi Honma, Tokyo (JP); Kinji Kayanuma, Tokyo (JP)

(73) Assignee: NEC Corporation, Tokyo (JP)

( * ) Notice: Subject to any disclaimer, the term of this patent is extended or adjusted under 35 U.S.C. 154(b) by 562 days.

(21) Appl. No.: 10/337,378

(22) Filed: Jan. 7, 2003

(65) Prior Publication Data

US 2003/0128643 A1   Jul. 10, 2003

(30) Foreign Application Priority Data

Jan. 10, 2002   (JP) .............................. 2002-003945

(51) Int. Cl.
*G11B 7/00* (2006.01)

(52) U.S. Cl. ................................ 369/53.34; 369/47.28; 369/59.19

(58) Field of Classification Search ...................... None
See application file for complete search history.

(56) References Cited

U.S. PATENT DOCUMENTS 6,072,756 A * 6/2000 Shigenobu ............... 369/47.19

6,324,136 B1 * 11/2001 Yoshida et al. .......... 369/47.22
6,735,160 B1 * 5/2004 Miyashita et al. ....... 369/59.12
2003/0185128 A1 * 10/2003 Shoji et al. .............. 369/59.25

FOREIGN PATENT DOCUMENTS

| JP | 63-33925 | 2/1988 |
|----|----------|--------|
| JP | 8-274628 | 10/1996 |

* cited by examiner

*Primary Examiner*—Brian E. Miller
*Assistant Examiner*—Peter Vincent Augustin
(74) *Attorney, Agent, or Firm*—Young & Thompson (57) ABSTRACT

A VCO, which good temperature characteristics, high frequency accuracy, and high phase accuracy is provided as an LSI, without making its master clock frequency operate the VCO high. The VCO includes a digital VCO, a phase modulator, and a frequency band limiting element. The digital VCO outputs an oscillating frequency clock and a phase difference lower than an output cycle resolution at the same timing as the output of the oscillating frequency clock. The phase modulator makes side-band components of the output from the digital VCO move from positions near the fundamental frequency to farther bands by modulating the phase of the output from the digital VCO based on the phase difference.

14 Claims, 8 Drawing Sheets

FIG. 1 PRIOR ART

SPECTRUM OUTPUTTED FROM CONVENTIONAL DIGITAL VCO

VCO WITH PHASE MODULATED OUTPUT

BACKGROUND OF THE INVENTION

The present invention relates to a voltage controlled oscillator (VCO) in which digital signals are processed and a phase locked loop (PLL) circuit using this VCO and a data recording apparatus using this PLL circuit.

DESCRIPTION OF THE RELATED ART

In data recording apparatuses for like the CD-R system and the DVD-R/RW system, which record data on a recording medium such as an optical disk and reproduce data from the recording medium, in order to generate a recording clock for recording data, a synchronizing clock is generated by obtaining a rotation synchronizing signal of the recording medium, and the synchronizing clock is made to be the recording clock. In order to generate the synchronizing clock, a PLL circuit is used. The PLL circuit is utilized for various purposes, in addition to generating the synchronizing clock.

A VCO is often used in a PLL circuit. The VCO changes an output oscillating frequency by an input signal voltage level. That is, the VCO is an oscillator that outputs a frequency corresponding to an input signal voltage level. The PLL circuit can output a synchronizing clock for an input signal, by that the output phase and frequency from the VCO are controlled to synchronize with the input signal.

The characteristics of an analog VCO have dispersion largely when it is manufactured, and also depend largely on ambient temperature. Therefore, the characteristics of the analog VCO are stabilized by using a PLL circuit. However, in case that the performance of an apparatus using the PLL circuit is changed by the characteristics of the PLL circuit, or a wide band oscillation is required, or the dispersion of the characteristics of the PLL circuit realized by an LSI is desired to be low, it is effective to use a digital VCO.

The digital VCO has following advantages because of its digital circuits. The dispersion of its characteristics is low, and the digital VCO is easily realized by an LSI and can keep linearity in its wide oscillating range.

First, a conventional digital VCO is studied. At the digital VCO, it is defined that an output oscillating frequency is F and the frequency of the master clock to operate the VCO is Fref. Generally, a crystal oscillator generates the master clock. In this, a frequency control input signal to the digital VCO is a digital value shown by certain bits. The output from the digital VCO is a pulse (clock) having an oscillating frequency corresponding to the frequency control input signal.

The output cycle resolution (output frequency resolution) of the digital VCO depends on the master clock frequency Fref that operates the digital VCO. In case that the output oscillating frequency F, which is desired to output, becomes equal to Fref/N (N is an integer), an accurate output oscillating frequency can be obtained. However, when the output oscillating frequency F is desired to be a frequency between Fref/N and Fref/(N+1), an accurate output oscillating frequency cannot be obtained. In this case, it is necessary that a pulse of cycle N/Fref (=frequency Fref/N) and a pulse of cycle (N+1)/Fref (=frequency Fref/(N+1)) are outputted alternately with a certain ratio. With this operation, a shift is generated at each clock timing, but the desired output oscillating frequency can be obtained as a whole.

At the digital VCO, in case that a frequency between Fref/N and Fref/(N+1) is outputted (this output oscillating frequency is defined as "f" in the output oscillating frequency F), a phase shift is generated between an ideal output oscillating frequency "f" and an actual output oscillating frequency (output clock). This phase shift is defined as phase difference $\phi$.

The maximum value $\phi m$ of this phase difference $\phi$, which is generated at below the output cycle resolution of the digital VCO, decided by the master clock frequency Fref to operate the VCO, is shown in the equation (1). It is desirable that this maximum value $\phi m$ is small.

$$\phi m = 2\pi \times f / F\text{ref} \qquad (1)$$

In case that the digital VCO outputs the output oscillating frequency "f", when the number of outputting times of the pulse of cycle (N+1)/Fref is defined as $\alpha$ (0<$\alpha$<1), and the number of outputting times of the pulse of cycle N/Fref is defined as (1−$\alpha$), the output oscillating frequency "f" is shown in the equation (2).

$$f = F\text{ref}/(N+\alpha) \qquad (2)$$

Figure 1:
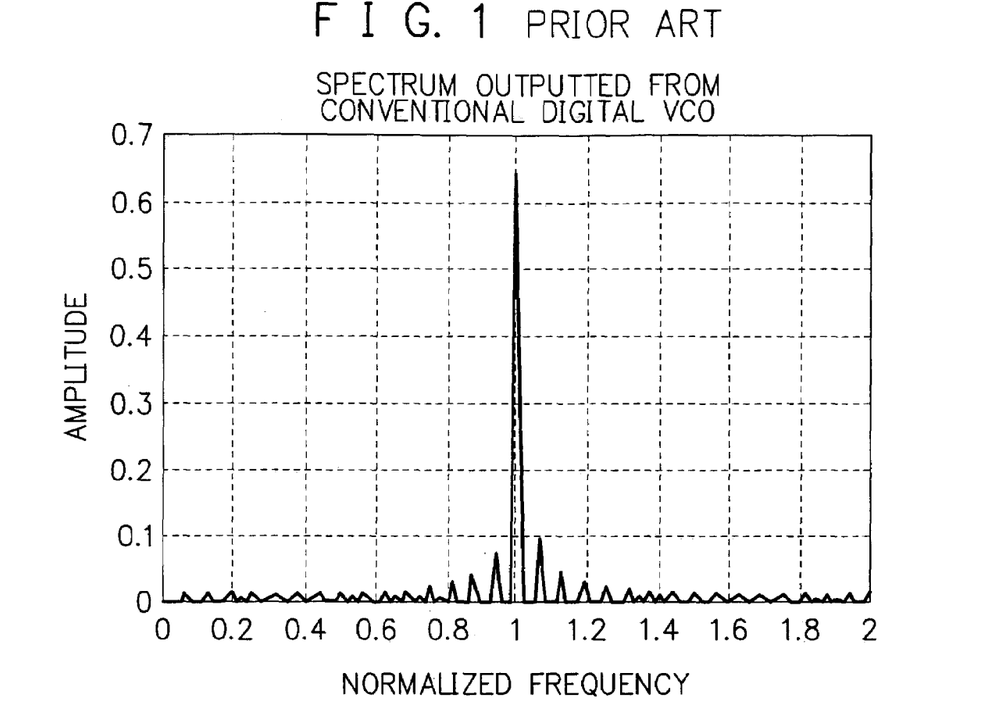
FIG. 1 is a graph showing a spectrum of the output oscillating frequency "f" at a conventional digital VCO.

FIG. 1 is a graph showing a spectrum of the output oscillating frequency "f" at the conventional digital VCO. As shown in FIG. 1, side-band components were generated at the adjacent positions of the fundamental frequency of the output oscillating frequency "f". The interval $\Delta f$ between the side-band components is shown in the equation (3).

$$\Delta f = f \times \alpha = F\text{ref} \times \alpha/(N+\alpha) \qquad (3)$$

Therefore, in case that the output oscillating frequency "f" is oscillated under the condition that the master clock frequency Fref is not higher than the output oscillating frequency "f", the interval $\Delta f$ becomes small from the equation (3), and the side-band components come close to the fundamental frequency.

Consequently, even when the output oscillating frequencies from the digital VCO are averaged by connecting an analog PLL circuit to the next stage of the digital VCO, the side-band components cannot be eliminated by the influence of these side-band components having small interval $\Delta f$, positioned near the fundamental frequency, and jitters of the output clock (output oscillating frequency) are increased.

When the master clock frequency Fref is made to be high, the interval $\Delta f$ for the output oscillating frequency "f" becomes large and also the maximum value of the phase difference $\phi m$ becomes small, consequently, the side-band components for any output oscillating frequency F can be made to be small.

When the output oscillating frequency F from the digital VCO is desired to be high, or an output clock whose phase is accurate is required, it is necessary that the master clock frequency Fref is made to be high. However, in case that the master clock frequency Fref is made to be high, the power consumption becomes high and designing a high speed circuit is required, and it is not so easy to realize this.

In order to solve this problem, as a first conventional technology, Japanese Patent Application Laid-Open No. SHO 63-33925 discloses a digital phase synchronizing circuit. In this digital phase synchronizing circuit, an output, from a digital phase shifter composed of a ROM in which recorded values that one cycle sine wave is divided into N equal parts and an address counter that reads out the values in the ROM at M cycle, is converted into an analog signal by a digital to analog converter (DAC). With this structure, the sine wave of M cycle can be outputted, but the signal is converted into an analog signal at the DAC, therefore, the resolution of the edge timing of the output wave is obtained as a value below the master clock cycle. Consequently, even the master clock frequency is not made to be high, an accurate output from the digital VCO can be obtained.

As a second conventional technology, Japanese Patent Application Laid-Open No. HEI 8-274628 discloses a digital PLL circuit. In this digital PLL circuit, multi-phase clocks are generated from a master clock at a multi-phase clock generating circuit composed of multi-stage delay circuits and one of the multi-phase clocks is outputted by selecting from the multi-phase clocks. With this, a VCO is composed by controlling timing being below the master clock cycle. For example, the accuracy of the VCO can be four times more by generating four-phase clocks at the multi-clock generating circuit.

However, at the first conventional technology, the DAC is required, therefore, when the digital phase synchronizing circuit is realized by an LSI, there are problems like that its layout is not easy and its operating speed is not high and its power consumption becomes high.

At the second conventional technology, the delay circuits are used to generate the multi-phase clocks, and when the frequency of the master clock is desired to change, it is necessary to adjust the amount of delay. Moreover, its operating margin is lowered caused by the temperature characteristics of the delay circuits. Furthermore, it is difficult to adjust the timing of the multi-phase clock operation and also to achieve the logic synthesis of the LSI.

SUMMARY OF THE INVENTION

It is therefore an object of the present invention to provide a VCO processing digital signals, in which temperature characteristics are good and high frequency accuracy and high phase accuracy can be realized without making the master clock frequency to operate the VCO high and its circuit can be realized by an LSI. Further, a PLL circuit using this VCO and a data recording apparatus like an optical disk drive using this PLL circuit are provided.

According to a first aspect of the present invention, for achieving the object mentioned above, there is provided a VCO. The VCO provides a digital VCO that outputs an oscillating frequency clock based on a digital frequency control input signal, a phase modulator to which the oscillating frequency clock outputted from the digital VCO is inputted, and a frequency band limiting means to which an output from the phase modulator is inputted. And the digital VCO also outputs phase difference lower than output cycle resolution decided by a master clock frequency to operate the digital VCO at the same timing of the output of the oscillating frequency clock, the phase modulator makes side-band components of the output from the digital VCO move from positions near a the fundamental frequency to farther bands by modulating the phase of the output from the digital VCO based on the phase difference, and the frequency band limiting means eliminates the side-band components moved to the farther bands by a frequency band limitation.

According to a second aspect of the present invention, in the first aspect, the digital VCO provides an adder, a decoder that executes remainder operation for an added result at the adder in a value N, a first register that latches a decoded result at the decoder, a comparator that outputs timing information at the time when the added result at the adder is larger than the value N as output edge timing information, and a second register that outputs the phase difference by latching the decoded result at the decoder based on the edge timing information from the comparator And the adder adds the frequency control input signal and a value holding in the first register.

According to a third aspect of the present invention, in the first aspect, the phase modulator provides a pulse generator that generates a phase controlling pulse based on the phase difference, and a selector that selects one from the inputted clock whose phase was shifted and was not shifted based on the phase controlling pulse generated at the pulse generator.

According to a fourth aspect of the present invention, in the third aspect, the pulse generator in the phase modulator divides the value of the phase difference into N equal parts depending on the size of the phase difference, and the pulse generator makes the number of occurrence times of the phase controlling pulse change in each of N equally divided time regions based on the value of the phase difference.

According to a fifth aspect of the present invention, in the first aspect, the frequency band limiting means is a band-pass filter (BPF).

According to a sixth aspect of the present invention, in the first aspect, the frequency band limiting means is a phase locked loop (PLL) circuit.

According to a seventh aspect of the present invention, there is provided a PLL circuit. The PLL circuit provides a phase comparator, a loop filter (LPF), a VCO in the aspects 1 to 5, or 1, 2, 3, 4, and 6, and a frequency divider. And the phase comparator outputs phase difference information between an inputted signal and an output from the frequency divider, the LPF averages the phase difference information outputted from the phase comparator and outputs a frequency control input signal, the VCO outputs an oscillating frequency clock by inputting the frequency control input signal outputted from the LPF, and the frequency divider divides the oscillating frequency clock outputted from the VCO into N parts, and inputs the divided N parts to the phase comparator. And the VCO also outputs the oscillating frequency clock as a clock whose phase was synchronized with the inputted signal.

According to an eighth aspect of the present invention, there is provided a data recording apparatus, which records data on a recording medium and reproduces data from the recording medium. The data recording apparatus provides a PLL circuit in the aspect 7. And the PLL circuit outputs a phase synchronized clock by inputting a rotation synchronizing signal of the recording medium, and data recording is executed by that the phase synchronized clock is made to be a recording clock.

According to a ninth aspect of the present invention, in the eighth aspect, the recording medium is an optical disk, and a wobble signal is used as the rotation synchronizing signal.

BRIEF DESCRIPTION OF THE DRAWINGS

The objects and features of the present invention will become more apparent from the consideration of the following detailed description taken in conjunction with the accompanying drawings in which.

DESCRIPTION OF THE PREFERRED EMBODIMENTS

Figure 2:
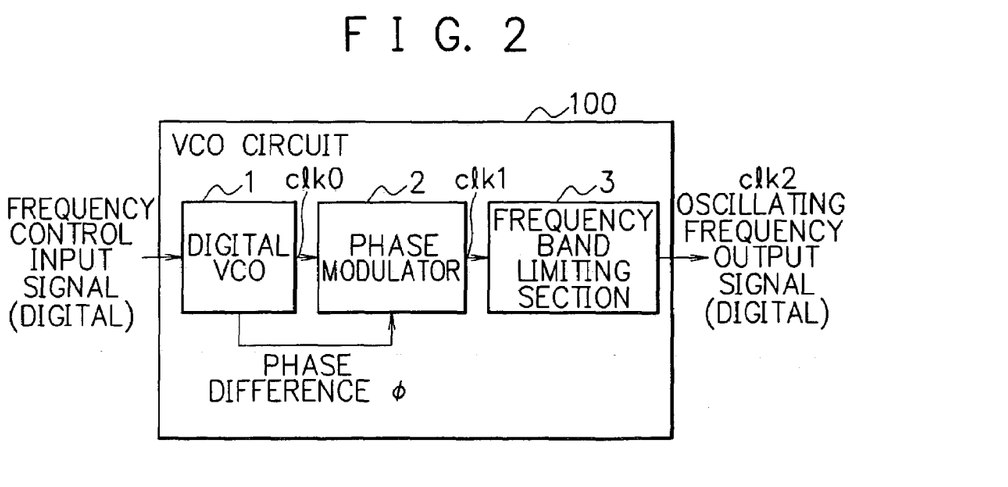
FIG. 2 is a block diagram showing the structure of a VCO circuit at an embodiment of the present invention.

Referring now to the drawings, embodiments of the present invention are explained in detail. FIG. 2 is a block diagram showing the structure of a VCO circuit at an embodiment of the present invention. As shown in FIG. 2, a VCO circuit 100 in an embodiment of the present invention consists of a digital VCO 1, a phase modulator 2, and a frequency band limiting section 3.

The present invention is different from the conventional technology in that the VCO circuit provides a phase modulating means for modulating the phase of an output from a digital VCO, and a frequency band limiting means for limiting the frequency band of the output from the phase modulating means. The VCO circuit of the present invention makes side-band components, which are not needed fundamentally, move from the positions near the fundamental frequency to farther bands, by modulating the phase of the output from the digital VCO by using phase difference $\phi$ generating in the digital VCO. Further, the side-band components are eliminated by the frequency band limiting means positioned at the next stage of the phase modulating means. With this operation, a clock having low jitters is generated.

In FIG. 2, a frequency control input signal to the VCO circuit 100 and an oscillating frequency output signal from the VCO circuit 100 are digital signals, and also signals inside the VCO circuit 100 are digital signals. The digital VCO 1 outputs a clock clk0 by generating an oscillating frequency corresponding to the inputted frequency control input signal. Further, the digital VCO 1 outputs phase difference $\phi$ at the same time outputting the clock clk0.

The outputted clock clk0 and the phase difference $\phi$ are inputted to the phase modulator 2. The phase modulator 2 applies a phase modulation to the inputted clock clk0 based on the phase difference $\phi$, and outputs a clock clk1 whose phase was modulated. The clock clk1 is inputted to the frequency band limiting section 3. A clock clk2 (oscillating frequency output signal) is outputted from the VCO circuit 100 by that the frequency band of the inputted clock clk1 is limited at the frequency band limiting section 3.

As the frequency band limiting section 3, for example, a band-pass filter (BPF) is used. And also as the frequency band limiting section 3, a PLL circuit or a multiplying PLL circuit can be used. As far as the PLL circuit is in a locked state, it is well known that a band limitation is applied to the inputted signal as the same as the BPF is used.

Figure 3:
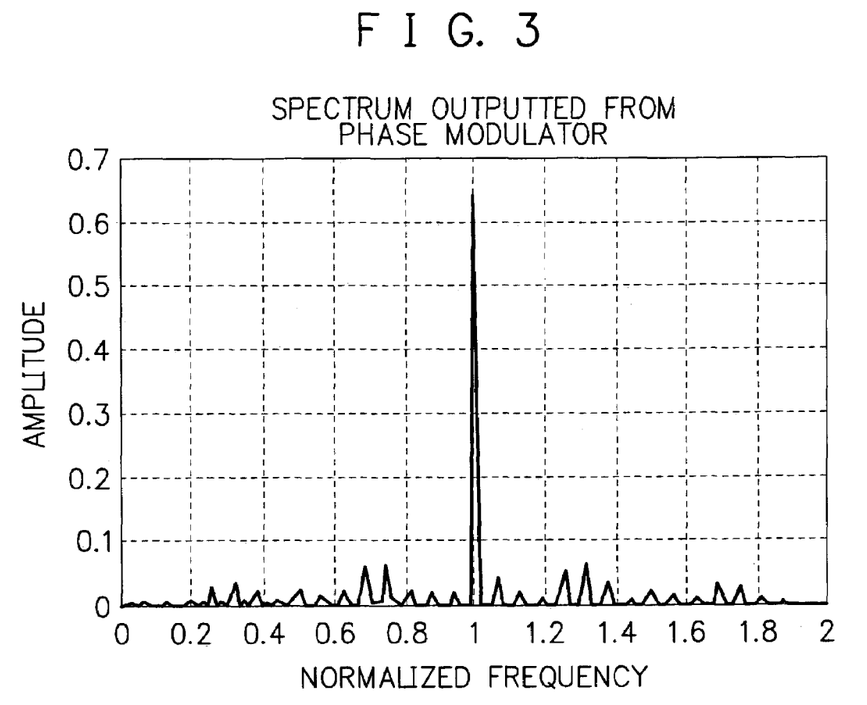
FIG. 3 is a graph showing a spectrum outputted from a phase modulator in the VCO circuit shown in FIG. 2.

Next, the principle of the operation of the VCO circuit 100 at the embodiment of the present invention is explained. In this, the master clock frequency is defined as Fref as mentioned before and a cycle is defined as T. At a digital VCO operating with this master clock frequency Fref, for example, it is assumed that a clock having cycle (8+1/16) T is oscillated. In the equation (2) mentioned before, this case is N=8, and $\alpha$=1/16. In this case, it is necessary that a pulse having cycle of 8T and a pulse having cycle of 9T are outputted alternately in the ratio of 15:1. FIG. 3 is a graph showing a spectrum outputted from the phase modulator 2 in the VCO circuit 100 at the embodiment of the present invention. As shown in FIG. 3, the side-band components are distributed symmetrically for the fundamental frequency. In this case the interval $\Delta f$=1/129T.

At the conventional technology, even the output from the phase modulator 2 is stabilized by inputting the output to an analog PLL circuit, the side-band components near the fundamental frequency cannot be eliminated and the accuracy of the clock becomes worse caused by jitters from these side-band components.

At the VCO circuit 100 of the present invention, the phase modulator 2 applies a phase modulation to the clock clk0 being the output from the digital VCO 1 by using the phase difference $\phi$ outputted from the digital VCO 1.

In this phase modulation, for example, the cycle of output pulse for the input clock clk0 is made to be a unit of {8T, 9T, 7T, 8T, 9T, 8T, 7T, 9T, 8T, 8T, 8T, 8T, 8T, 8T, 8T, 8T} in time series, and the output pulse is oscillated repeatedly in this unit. As the result of the phase modulation, as shown in FIG. 3, the characteristics of the side-band components can be changed without changing the fundamental frequency. Especially, the side-band components near the fundamental frequency can be moved to farther band positions from the fundamental frequency. That is, the interval $\Delta f$ becomes larger than that before the phase modulation is applied.

Further, the side-band components moved to the farther band positions are eliminated by inputting the clock clk1 applied the phase modulation to the frequency band limiting section 3 (BPF or PLL circuit). The side-band components near the fundamental frequency can be eliminated easily at the frequency band limiting section 3, because the interval $\Delta f$ has become larger.

Figure 4:
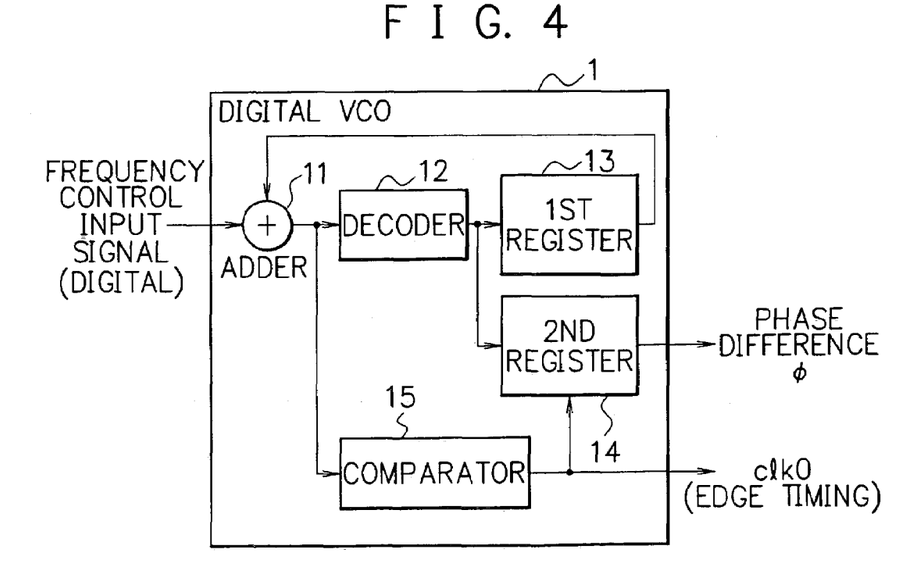
FIG. 4 is a block diagram showing the structure of a digital VCO shown in FIG. 2.

Next, the structure of the digital VCO 1 in the VCO circuit 100 is explained in detail. FIG. 4 is a block diagram showing the structure of the digital VCO 1 in the VCO circuit 100 at the embodiment of the present invention. As shown in FIG. 4, the digital VCO 1 consists of an adder 11, a decoder 12, a first register 13, a second register 14, and a comparator 15.

Each section in the digital VCO 1 operates by synchronizing with a master clock. The frequency control input signal (digital) is inputted to the adder 11. The phase value of the inputted signal is integrated every input of the master clock, by the adder 11 and the first register 13, which latches the added result at the adder 11. That is, the function of the adder 11 and the first register 13 can be said to be an integrator.

The added result at the adder 11 is inputted to the decoder 12. The decoder 12 executes the remainder operation (mod N) for the added result (phase integrated value) by a designated value N. The output from the decoder 12 is inputted to the first register 13 and the second register 14.

The added result at the adder 11 is also inputted to the comparator 15. The comparator 15 compares the inputted added result with the value N being the same value mentioned at the decoder 12, and outputs a timing at the time when the inputted added result is larger than the value N as the edge timing of the clock clk0 being the output from the digital VCO 1. The edge timing is also inputted to the second register 14 The second register 14 latches the output from the decoder 12, synchronizing with this edge timing, and holds the latched output, and outputs this held value as the phase difference φ.

Figure 5:
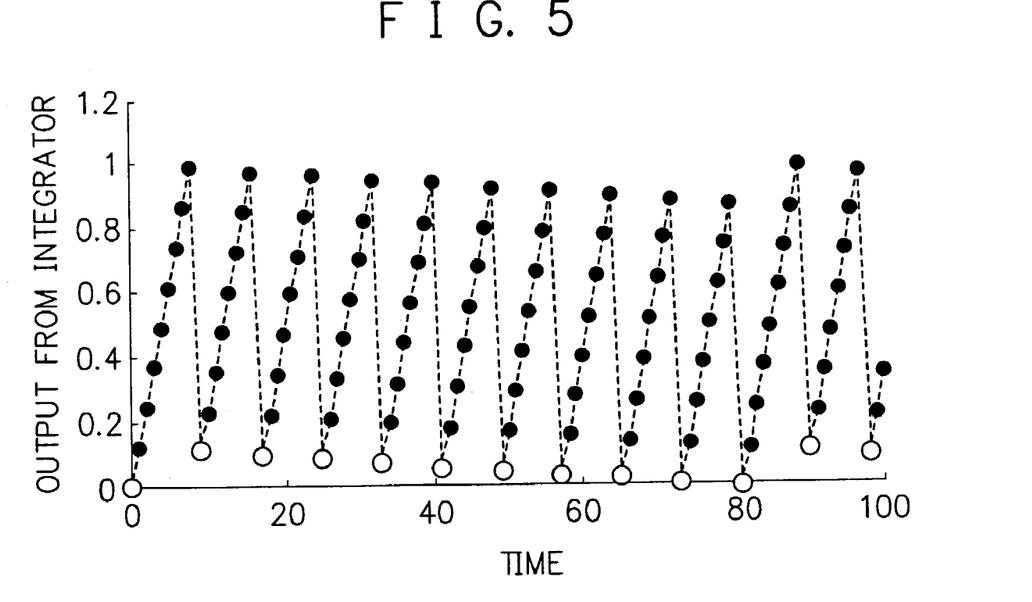
FIG. 5 is a graph showing an output from an integrator in case that the clock of the cycle 8.1T is outputted in the master clock cycle T at the digital VCO in the VCO circuit shown in FIG. 2.

Next, the operation of the digital VCO 1 is explained. FIG. 5 is a graph showing an output from the integrator in case that the clock of the cycle 8.1T is outputted in the master clock cycle T at the digital VCO 1 in the VCO circuit 100 at the embodiment of the present invention. In this, the output from the integrator is the output from the first register 13 and is the phase integrated value. As mentioned above, the function added the adder 11 and the first register 13 works as the integrator, and the graph shows the output from the first register 13. In FIG. 5, the phase differences φ being the output from the second register 14 is also shown.

As shown in FIG. 5, the output is distributed as the shape of saw-teeth. The minimum value in each of the saw-teeth shown as a white point is the phase difference φ. The phase difference φ forms a distribution in which the frequency of the phase difference φ is lower than that of the output from the integrator shown as black points. In this, the output from the integrator, shown in the vertical axis, shows a value that the remainder operation is applied to the output phase at 2π and after this normalized by 2π.

Figure 6:
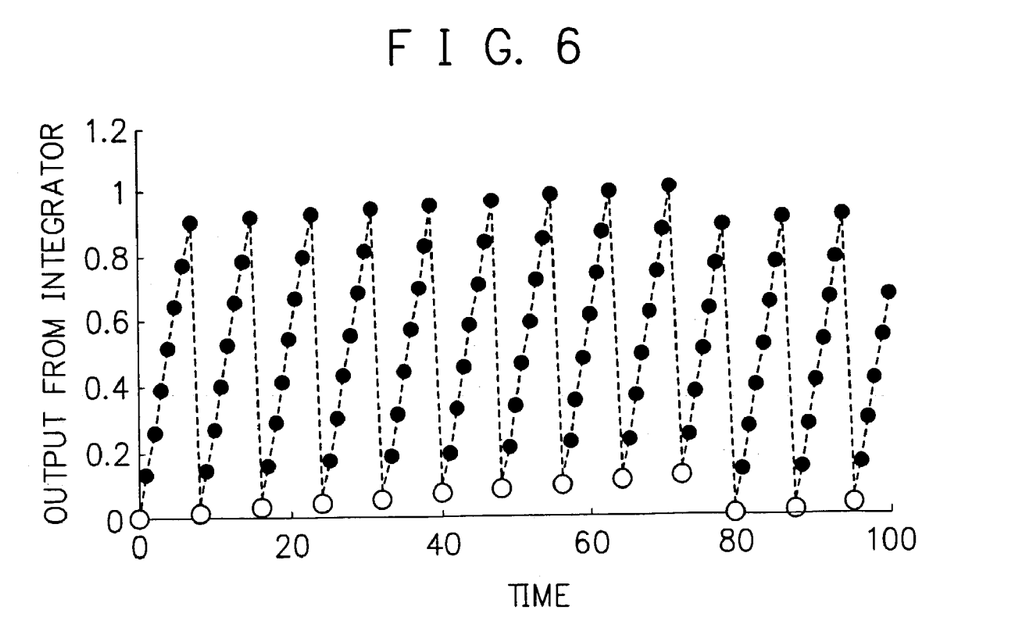
FIG. 6 is a graph showing an output from the integrator in case that the clock of the cycle 7.9T is outputted in the master clock cycle T at the digital VCO in the VCO circuit shown in FIG. 2.

FIG. 6 is a graph showing an output from the integrator in case that the clock of the cycle 7.9T is outputted in the master clock cycle T at the digital VCO 1 in the VCO circuit 100 at the embodiment of the present invention. As shown in FIG. 6, the polarity of the phase difference φ is reversed, compared with the polarity in FIG. 5.

Since the digital VCO 1 is structured as mentioned above, the output oscillating frequency "f" can be outputted and also the phase difference φ can be outputted with high accuracy.

Figure 7:
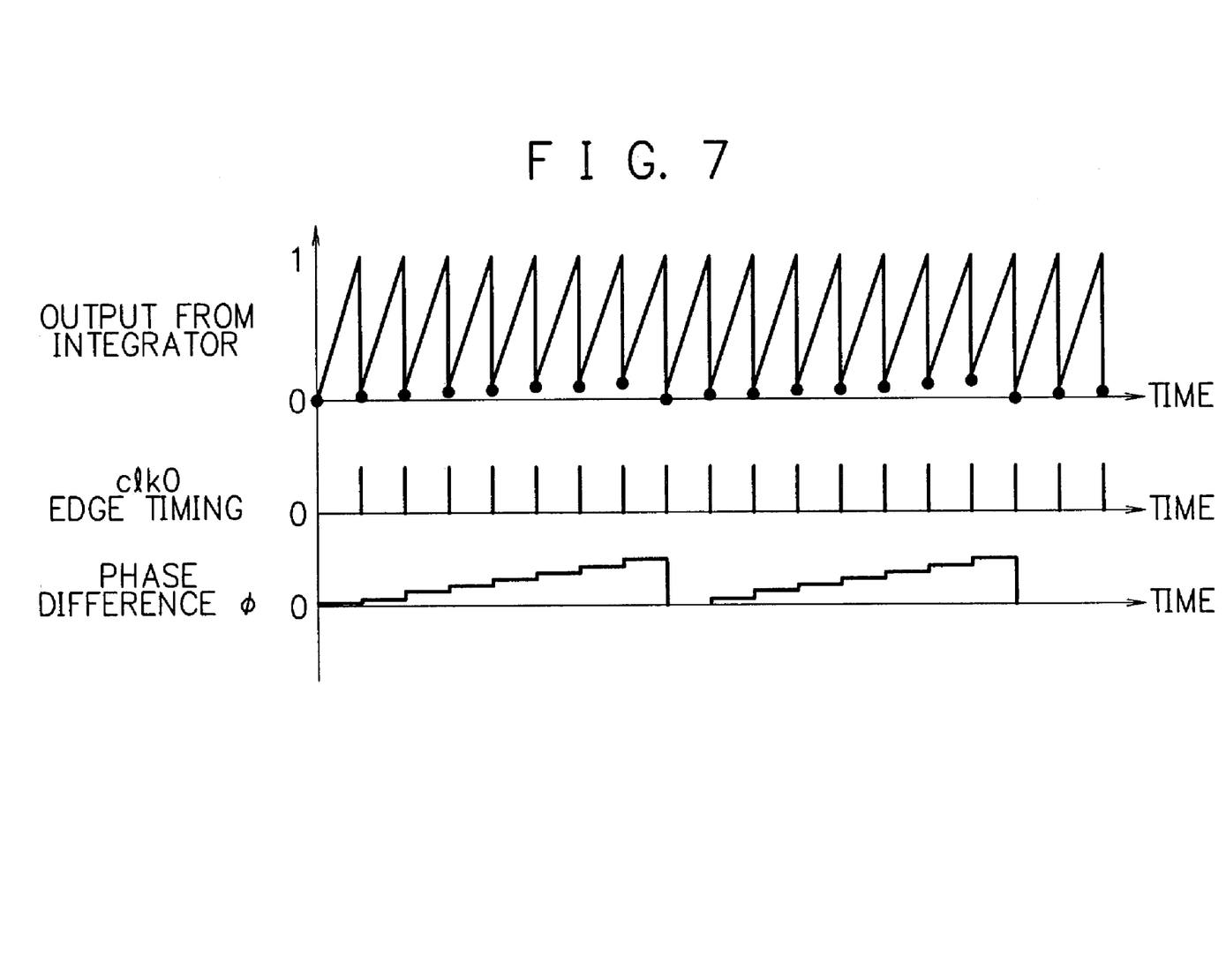
FIG. 7 is a diagram showing outputs from the digital VCO in the VCO circuit shown in FIG. 2.

FIG. 7 is a diagram showing the outputs from the digital VCO 1 in the VCO circuit 100 at the embodiment of the present invention. In FIG. 7, the output from the integrator (phase integrated values), the edge timing of the clock clk0, and the phase difference φ are shown.

Figure 8:
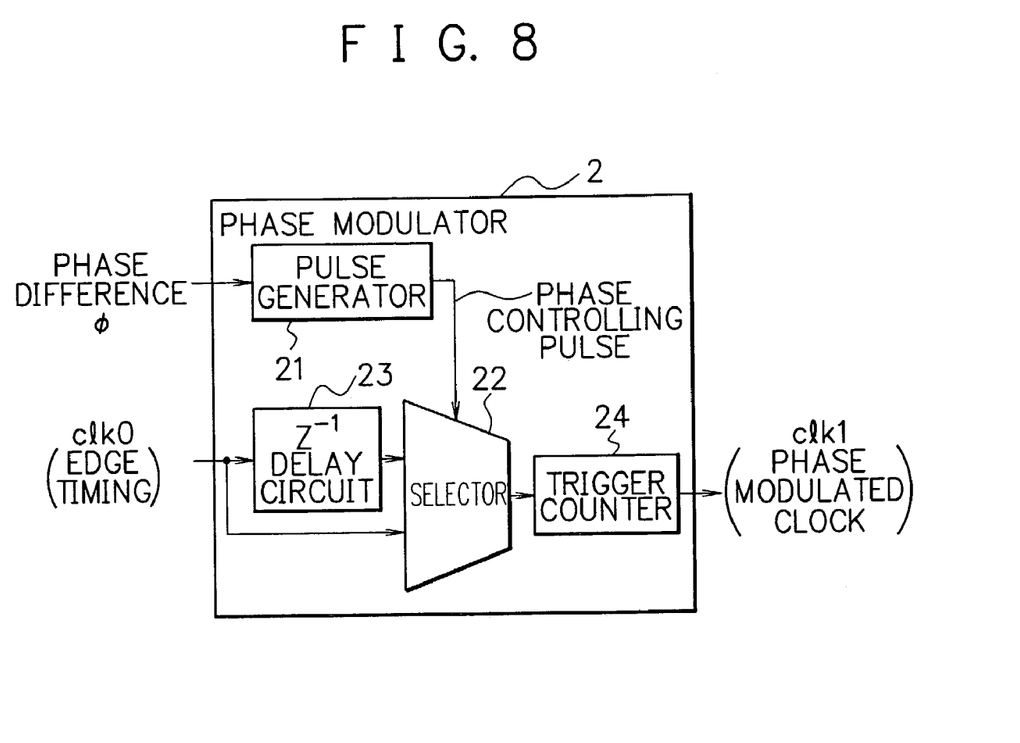
FIG. 8 is a block diagram showing the structure of the phase modulator in the VCO circuit shown in FIG. 2.

Next, the phase modulator 2 in the VCO circuit 100 is explained in detail. FIG. 8 is a block diagram showing the structure of the phase modulator 2 in the VCO circuit 100 at the embodiment of the present invention. As shown in FIG. 8, the phase modulator 2 consists of a pulse generator 21, a selector 22, a delay circuit 23, and a trigger counter 24. The output from the digital VCO 1, being the clock clk0 (edge timing), is inputted to the delay circuit 23 and the selector 22, and the phase difference φ is inputted to the pulse generator 21.

The inputted clock clk0 is delayed at the delay circuit 23 by the amount of the master clock cycle T, and the selector 22 selects one from the delayed one and not delayed one. With this, the phase modulation of 2π×F/Fref can be applied to the inputted clock clk0. A control signal (phase controlling pulse) for the selector 22 is generated at the pulse generator 21 based on the phase difference s from the digital VCO 1. The output signal from the selector 22 is inputted to the trigger counter 24, and the trigger counter 24 converts the inputted signal into a clock whose duty ratio is 50%, and the converted signal is outputted as the phase modulated clock clk1. The pulse generator 21 generates the phase controlling pulse for the selector 22, based on the phase difference φ. The pulse generator 21 changes the number of occurrence times of the phase controlling pulse by the value of the phase difference φ.

The selector 22 changes the cycle of the inputted clock clk0 by shifting the phase of the inputted clock clk0 based on the phase controlling pulse. For example, in case that the inputted clock clk0 is {8T, 8T, 8T}, when the selector 22 is changed by the phase controlling pulse (0,1,0), the output from the selector 22 becomes {8T, 9T, 7T}, by that the 8T is outputted by the first 0, the 9T is outputted by delaying (shifting) by T by the second 1, and the 7T is outputted by returning to not delay by the third 0. For example, when the pattern {8T, 9T, 7T, 8T, 9T, 8T, 7T, 9T, 8T, 8T, 8T, 8T, 8T, 8T, 8T, 8T} mentioned above is desired to output as the phase modulation for the pattern of the inputted clock clk0 in time series {8T×15 times, 9T×once}, the phase controlling pulse becomes (0, 1, 0, 0, 1, 1, 0, 1, 1, 1, 1, 1, 1, 1, 1, 1).

Figure 9:
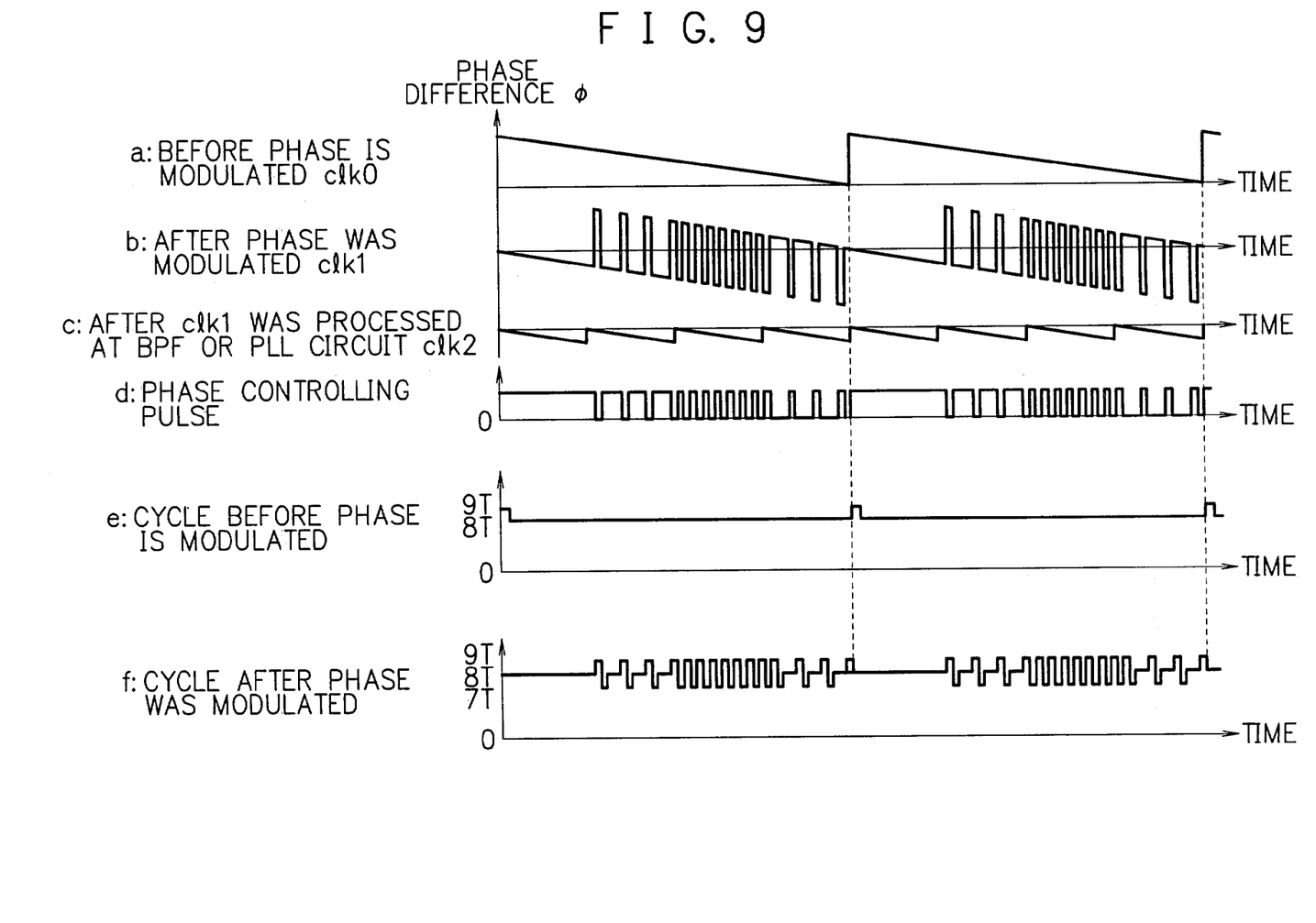
FIG. 9 is a diagram showing outputs from each section in the VCO circuit shown in FIG. 2 and the series of the pulse cycles at the time before the phase modulation is applied and after the phase modulation was applied at the phase modulator.

Next, the operation of the phase modulator 2 is explained. FIG. 9 is a diagram showing outputs from each section in the VCO circuit 100 and the series of the pulse cycles at the time before the phase modulation is applied and after the phase modulation was applied at the phase modulator 2.

In FIG. 9, symbols a, b, c, d, e, and f are explained. The "a" shows the phase difference φ of the clock clk0 being the output from the digital VCO 1, that is, the phase difference φ of the clock clk0 before the phase of the clock clk0 is modulated is shown in the "a". The "b" shows the phase difference φ of the clock clk1 being the output from the phase modulator 2, that is, the phase difference d of the clock clk1 after the phase of the clock clk0 was modulated is shown in the "b". The "c" shows the phase difference φ of the clock clk2 being the output from the frequency band limiting section 3, that is, the phase difference φ of the clock clk2 after the clock clk1 was processes at the frequency band limiting section 3 (BPF or PLL circuit). The "d" shows the phase controlling pulse being the output from the pulse generator 21. The "e" shows the series of the pulse cycles before the phase is modulated. And the "f" shows the series of the pulse cycles after the phase was modulated. In FIG. 9, the phase difference φ shows in case that the a is smaller than that in FIG. 7.

At the digital VCO 1, in case that the output oscillating frequency F is "f" (=Fref/(N+α)) and the α is a value that is slightly shifted from 0, the phase difference φ having the shape of saw-teeth being the low frequency is outputted. In this case, when the trend of the cycle is studied, it is understandable that a correction by 1 cycle T of the master clock is applied at the edge timing of the saw-teeth formed by the phase difference φ. That is, the correction from the "a" to the "c" is applied.

Next, a method to apply the phase modulation to the inputted clock clk0 is explained. For example, the pulse generator 21 divides the inputted phase difference φ into four equal parts depending on the size of the value of the inputted phase difference φ, or for the cycle to which a correction is totally applied for the output. And the pulse modulator 21 changes the number of occurrence times of the phase controlling pulse in the four equal regions in the following cases, and the selector 22 shifts the phase of the clock clk0.

The cases mentioned above are explained.

(1). In case that the phase difference φ is 0 or more and less than T/4:
the phase controlling pulse "1" is outputted once in the output clock 4 cycles.

(2). In case that the phase difference φ is T/4 or more and less than T/2: the phase controlling pulse "1" is outputted twice in the output clock 4 cycles.
(3). In case that the phase difference φ is T/2 or more and less than 3T/4: the phase controlling pulse "1" is outputted three times in the output clock 4 cycles.
(4). In case that the phase difference φ is 3T/4 or more: the phase controlling pulse "1" is outputted all in the output clock 4 cycles.

At the pulse generator 21, the phase controlling pulse is generated in the method mentioned above (FIG. 9d), and the selector 22 shifts the phase of the inputted clock clk0 based on this phase controlling pulse. The phase difference φ of the phase modulated clock clk1 has a waveform like its pulse width was modulated as shown in FIG. 9b. When the trend at this time is studied, a modulation was applied by a higher frequency than that before the phase modulation is applied. Therefore, by averaging the phase modulated clock clk1s at the frequency band limiting section 3, as shown in FIG. 9c, the phase difference φ is compressed into about ¼ of the phase difference φ before the phase is modulated. And an output whose jitters are low can be obtained.

At the explanation mentioned above, the pulse generator 21 divided the inputted phase difference φ into four equal parts. However, the pulse generator 21 can divide the inputted phase difference φ into N (an integer) equal parts depending on the size of the value of the inputted phase difference φ.

Figure 10:
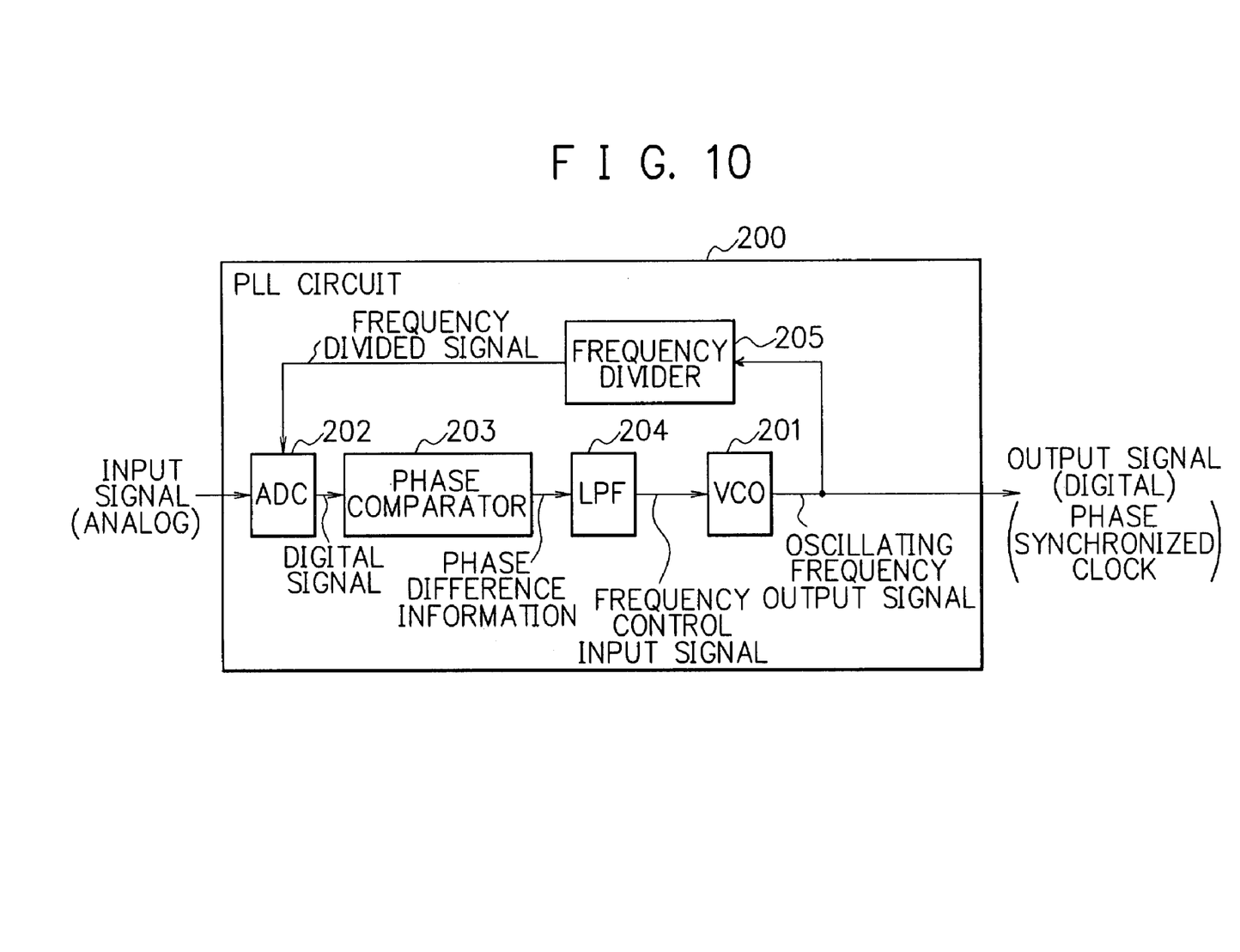
FIG. 10 is a block diagram showing the structure of a PLL circuit at the embodiment of the present invention.

FIG. 10 is a block diagram showing the structure of a PLL circuit 200 at the embodiment of the present invention. As shown in FIG. 10, the PLL circuit 200 consists of a VCO 201, an analog to digital converter (ADC) 202, a phase comparator 203, a loop filter (LPF) 204, and a frequency divider 205. In this, the VCO 201 is equivalent to the VCO circuit 100 shown in FIG. 2. An input signal to the PLL circuit 200 is an analog signal. The PLL circuit 200 outputs a phase synchronized clock, by controlling the oscillating frequency at the VCO 201 for the inputted analog signal.

The oscillating frequency clock (oscillating frequency output signal) outputting from the VCO 201 becomes an output signal from the PLL circuit 200 as a clock being synchronized with the inputted signal, and also is inputted to the frequency divider 205. The frequency divider 205 divides the inputted oscillating frequency clock into N parts and outputs the N parts. The output from the frequency divider 205 is inputted to the ADC 202 and become its sampling clock. At the ADC 202, the inputted signal (analog) is converted into a digital signal based on the sampling clock, and the digital signal is inputted to the phase comparator 203. The phase comparator 203 outputs phase difference information (digital) between the signal inputted to the PLL circuit 200 and the output from the frequency divider 205 based on the inputted digital signal. This phase difference information is different from the phase difference φ. The phase difference information is averaged at the LPF 204, and its averaged signal becomes the frequency control input signal (digital) to the VCO 201. That is, a PLL feedback loop is established as mentioned above.

In this, it is possible that the PLL circuit 200 does not provide the ADC 202. In this case, the input signal is digital and the phase comparator 203 counts the phase comparison between the inputted digital signal and the output from the frequency divider 205 by using an inside high speed clock and outputs the phase difference information.

Figure 11:
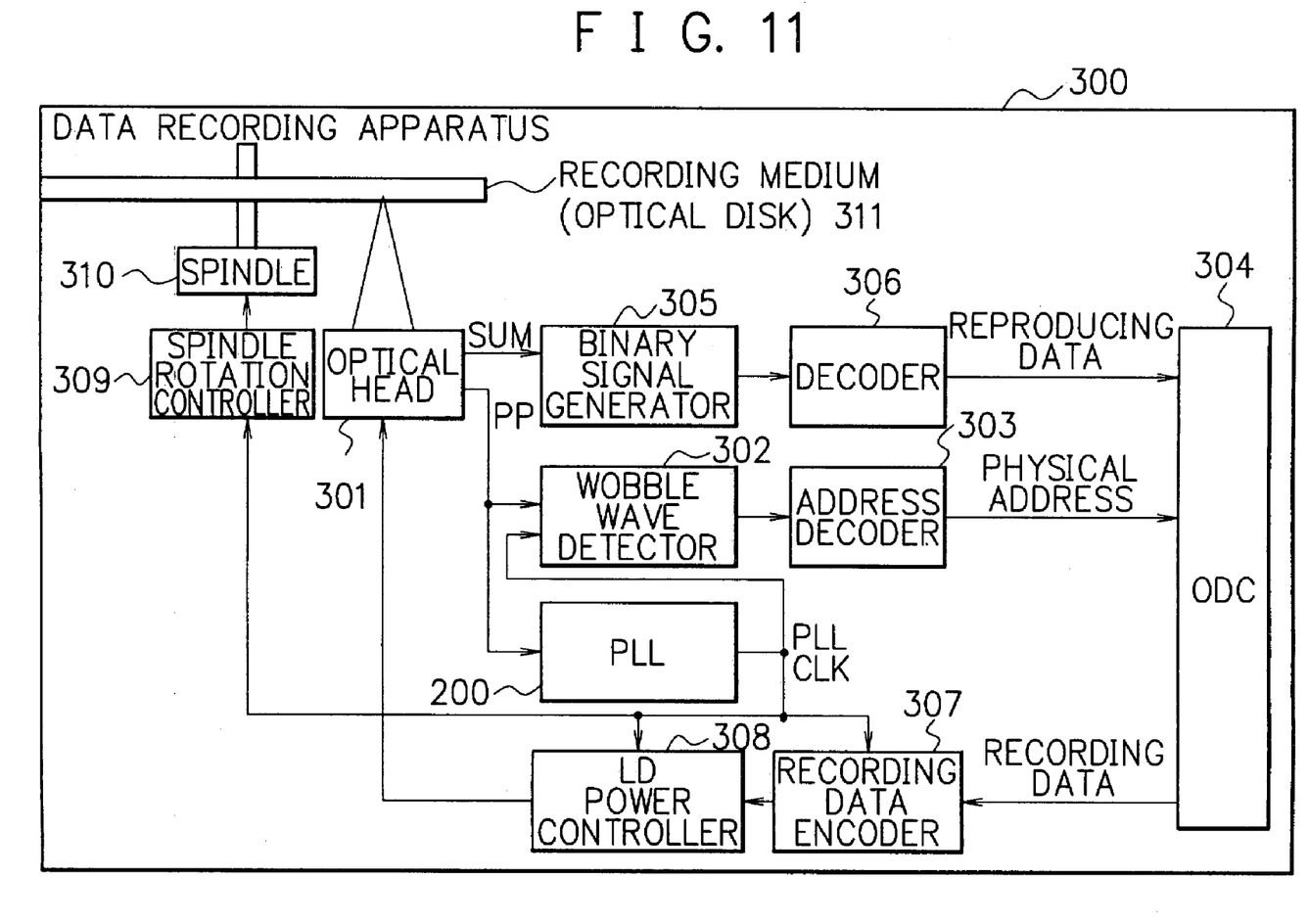
FIG. 11 is a block diagram showing the structure of a data recording apparatus at the embodiment of the present invention.

FIG. 11 is a block diagram showing the structure of a data recording apparatus 300 at the embodiment of the present invention. The data recording apparatus 300 provides the PLL circuit 200 mentioned above in its signal recording and reproducing system. As shown in FIG. 11, the data recording apparatus 300 provides the PLL circuit 200, an optical head 301, a wobble wave detector 302, an address decoder 303, an optical disk controller (ODC) 304, a binary signal generator 305, a decoder 306, a recording data encoder 307, a laser diode (LD) power controller 308, a spindle rotation controller 309, a spindle 310, and a recording medium (optical disk) 311.

As this data recording apparatus 300, an optical disk data recording apparatus that provides the PLL circuit 200 mentioned above is explained. That is, the recording medium 311, on which data are recorded, is an optical disk. The data recorded on the optical disk 311 are reproduced by a signal reproducing system composed of the optical head 301, the PLL circuit 200, and others. Data are recorded on the optical disk 311 by a data recording system. The ODC 304 is composed of a digital signal processor (DSP) and others, and controls the data recording and the data reproducing.

A wobble signal is added to a push-pull signal (analog), read from the optical disk 311, in which a guide groove, applied wobbling by a frequency that cannot be traced by a tracking actuator of the optical head 301, is formed. The push-pull signal is inputted to the PLL circuit 200 and the wobble wave detector 302 after a band limiting process is applied to the push-pull signal.

The PLL circuit 200 outputs a synchronizing reproduction clock as that the wobble signal added to the push-pull signal is the rotation synchronizing signal. This output clock is used in the data recording process as the recording clock (PLL-CLK). The recording clock is inputted to the spindle rotation controller 309 and the rotation of the spindle 310 is controlled. At the same time, the recording clock is inputted to the recording data encoder 307 and the LD power controller 308, and the optical head 301 is controlled.

In this, as the rotation synchronizing signal, sensor information from a spindle motor (not shown) can be used, instead of the wobble signal. Or a signal taking out from a sensor provided additionally to the optical head 301 can be used as the rotation synchronizing signal.

Physical address information is added to the wobble signal that was added to the push-pull signal. The push-pull signal and the recording clock are inputted to the wobble wave detector 302, and the wobble wave detector 302 separates the physical address information from the wobble signal. The separated physical address information is inputted to the address decoder 303. The address decoder 303 detects a physical address and inputs the detected physical address to the ODC 304.

The ODC 304 generates and controls recording data and recording start timing, based on the physical address obtained from the address decoder 303. The recording data are outputted synchronizing with the recording clock by modulating at the recording data encoder 307. The LD power controller 308 controls the optical power of the LD based on the modulated recording data, and makes the optical head 301 thermally record the recording data on the optical disk 311. The data recorded on the optical disk 311 can be read out as the changes of the amount of reflection light by the optical head 301, therefore, a sum signal (SUM) can be used. The sum signal is inputted to the binary signal generator 305, and the reproducing data are inputted to the ODC 304 via the decoder 306.

As mentioned above, according to the present invention, a digital VCO, in which its temperature characteristics are good and the dispersion of its characteristics is small and its phase difference φ is made to be low without making its master clock frequency operating the circuit high and its clock whose jitters are low, can be provided. Further, a PLL circuit using this digital VCO and a data recording apparatus like an optical disk drive using this PLL circuit can be provided.

While the present invention has been described with reference to the particular illustrative embodiments, it is not to be restricted by those embodiments but only by the appended claims. It is to be appreciated that those skilled in the art can change or modify the embodiments without departing from the scope and spirit of the present invention.

What is claimed is:

1. A voltage controlled oscillator (VCO), comprising:
a digital VCO that outputs an oscillating frequency clock based on a digital frequency control input signal;
a phase modulator to which said oscillating frequency clock outputted from said digital VCO is inputted; and
a frequency band limiting means to which an output from said phase modulator is inputted, wherein:
said digital VCO also outputs a phase difference lower than an output cycle resolution decided by a master clock frequency to operate said digital VCO at the same timing of the output of said oscillating frequency clock,
said phase modulator makes side-band components of the output from said digital VCO move from positions near a fundamental frequency to farther bands by modulating the phase of the output from said digital VCO based on said phase difference, and
said frequency band limiting means eliminates said side-band components moved to said farther bands by a frequency band limitation.

2. A VCO in accordance with claim 1, wherein:
said digital VCO, comprises:
an adder;
a decoder that executes remainder operation for an added result at said adder in a value N;
a first register that latches a decoded result at said decoder;
a comparator that outputs timing information at the time when said added result at said adder is larger than said value N as output edge timing information; and
a second register that outputs said phase difference by latching said decoded result at said decoder based on said edge timing information from said comparator, and wherein:
said adder adds said frequency control input signal and a value holding in said first register.

3. A PLL circuit, comprising:
a phase comparator;
a loop filter (LPF);
a VCO as claimed in claim 2; and
a frequency divider, wherein:
said phase comparator outputs phase difference information between an inputted signal and an output from said frequency divider,
said LPF averages said phase difference information outputted from said phase comparator and outputs a frequency control input signal,
said VCO outputs an oscillating frequency clock by inputting said frequency control input signal outputted from said LPF, and
said frequency divider divides said oscillating frequency clock outputted from said VCO into N parts, and inputs said divided N parts to said phase comparator, and
said VCO also outputs said oscillating frequency clock as a clock whose phase was synchronized with said inputted signal.

4. A VCO in accordance with claim 1, wherein:
said phase modulator, comprises:
a pulse generator that generates a phase controlling pulse based on said phase difference; and
a selector that selects an inputted clock based on said phase controlling pulse generated at said pulse generator.

5. A VCO in accordance with claim 4, wherein:
said pulse generator in said phase modulator divides the value of said phase difference into N equal parts depending on the size of said phase difference, and
said pulse generator makes the number of occurrence times of said phase controlling pulse change in each of N equally divided time regions based on said value of said phase difference.

6. A PLL circuit, comprising:
a phase comparator;
a loop filter (LPF);
a VCO as claimed in claim 5; and
a frequency divider, wherein:
said phase comparator outputs phase difference information between an inputted signal and an output from said frequency divider,
said LPF averages said phase difference information outputted from said phase comparator and outputs a frequency control input signal,
said VCO outputs an oscillating frequency clock by inputting said frequency control input signal outputted from said LPF, and
said frequency divider divides said oscillating frequency clock outputted from said VCO into N parts, and inputs said divided N parts to said phase comparator, and
said VCO also outputs said oscillating frequency clock as a clock whose phase was synchronized with said inputted signal.

7. A PLL circuit, comprising:
a phase comparator;
a loop filter (LPF);
a VCO as claimed in claim 4; and
a frequency divider, wherein:
said phase comparator outputs phase difference information between an inputted signal and an output from said frequency divider,
said LPF averages said phase difference information outputted from said phase comparator and outputs a frequency control input signal,
said VCO outputs an oscillating frequency clock by inputting said frequency control input signal outputted from said LPF, and
said frequency divider divides said oscillating frequency clock outputted from said VCO into N parts, and inputs said divided N parts to said phase comparator, and
said VCO also outputs said oscillating frequency clock as a clock whose phase was synchronized with said inputted signal.

8. A VCO in accordance with claim 1, wherein:
said frequency band limiting means is a band-pass filter (BPF).

9. A PLL circuit, comprising:
a phase comparator;
a loop filter (LPF);
a VCO as claimed in claim 8; and
a frequency divider, wherein:
said phase comparator outputs phase difference information between an inputted signal and an output from said frequency divider, said LPF averages said phase difference information outputted from said phase comparator and outputs a frequency control input signal, said VCO outputs an oscillating frequency clock by inputting said frequency control input signal outputted from said LPF, and said frequency divider divides said oscillating frequency clock outputted from said VCO into N parts, and inputs said divided N parts to said phase comparator, and said VCO also outputs said oscillating frequency clock as a clock whose phase was synchronized with said inputted signal.

10. A VCO in accordance with claim 1, wherein:
said frequency band limiting means is a phase locked loop (PLL) circuit.

11. A PLL circuit, comprising:
a phase comparator;
a loop filter (LPF);
a VCO as claimed in claim 10; and
a frequency divider, wherein:
said phase comparator outputs phase difference information between an inputted signal and an output from said frequency divider, said LPF averages said phase difference information outputted from said phase comparator and outputs a frequency control input signal, said VCO outputs an oscillating frequency clock by inputting said frequency control input signal outputted from said LPF, and said frequency divider divides said oscillating frequency clock outputted from said VCO into N parts, and inputs said divided N parts to said phase comparator, and said VCO also outputs said oscillating frequency clock as a clock whose phase was synchronized with said inputted signal.

12. A PLL circuit, comprising:
a phase comparator;
a loop filter (LPF);
a VCO as claimed in claim 1; and
a frequency divider, wherein:
said phase comparator outputs phase difference information between an inputted signal and an output from said frequency divider, said LPF averages said phase difference information outputted from said phase comparator and outputs a frequency control input signal, said VCO outputs an oscillating frequency clock by inputting said frequency control input signal outputted from said LPF, and said frequency divider divides said oscillating frequency clock outputted from said VCO into N parts, and inputs said divided N parts to said phase comparator, and said VCO also outputs said oscillating frequency clock as a clock whose phase was synchronized with said inputted signal.

13. A data recording apparatus, which records data on a recording medium and reproduces data from said recording medium, comprising:
a PLL circuit as claimed in claim 12, wherein:
said PLL circuit outputs a phase synchronized clock by inputting a rotation synchronizing signal of said recording medium, and data recording is executed by that said phase synchronized clock is made to be a recording clock.

14. A data recording apparatus in accordance with claim 8, wherein:
said recording medium is an optical disk, and
a wobble signal is used as said rotation synchronizing signal.

* * * * *